(12) United States Patent
Carroll

(10) Patent No.: US 11,302,557 B2
(45) Date of Patent: Apr. 12, 2022

(54) ELECTROSTATIC CLAMPING SYSTEM AND METHOD

(71) Applicant: Applied Materials, Inc., Santa Clara, CA (US)

(72) Inventor: James Carroll, Gloucester, MA (US)

(73) Assignee: Applied Materials, Inc., Santa Clara, CA (US)

(*) Notice: Subject to any disclaimer, the term of this patent is extended or adjusted under 35 U.S.C. 154(b) by 159 days.

(21) Appl. No.: 16/864,821

(22) Filed: May 1, 2020

(65) Prior Publication Data

US 2021/0343565 A1    Nov. 4, 2021

(51) Int. Cl.
*H01T 23/00* (2006.01)
*H01L 21/683* (2006.01)
*H01L 21/67* (2006.01)

(52) U.S. Cl.
CPC .... *H01L 21/6833* (2013.01); *H01L 21/67017* (2013.01)

(58) Field of Classification Search
None
See application file for complete search history.

(56) References Cited

U.S. PATENT DOCUMENTS

| 2003/0002237 A1* | 1/2003 | Tossell | H01L 21/6831 |
| | | | 361/234 |
| 2016/0136782 A1* | 5/2016 | Hsu | B24B 49/10 |
| | | | 451/5 |

FOREIGN PATENT DOCUMENTS

| JP | 2000-243814 A | 9/2000 |
| JP | 2002-270677 A | 9/2002 |
| JP | 2019-192775 A | 10/2019 |
| KR | 10-2019-0132929 A | 11/2019 |

OTHER PUBLICATIONS

International Search Report dated Jul. 19, 2021, for the International Patent Application No. PCT/US2021/024343, filed on Mar. 26, 2021, 3 pages.
Written Opinion dated Jul. 19, 2021, for the International Patent Application No. PCT/US2021/024343, filed on Mar. 26, 2021, 4 pages.

* cited by examiner

*Primary Examiner* — Stephen W Jackson
(74) *Attorney, Agent, or Firm* — Kacvinsky Daisak Bluni PLLC

(57) ABSTRACT

An electrostatic clamping system including a platen, an electrostatic electrode associated with the platen, and a sealing cover having a concave lower surface defining a cavity and having a sealing ring extending about a periphery of the lower surface, the sealing cover movable relative to the platen for being moved onto, and being moved off of, a wafer disposed on the platen, the sealing cover further having an inlet valve for introducing a gas into a space between a cover body of the sealing cover and the wafer.

20 Claims, 4 Drawing Sheets

ELECTROSTATIC CLAMPING SYSTEM AND METHOD

FIELD OF THE DISCLOSURE

Embodiments of the present disclosure relate generally to the field of semiconductor device fabrication, and more particularly to a system and method for facilitating effective clamping of semiconductor wafers.

BACKGROUND OF THE DISCLOSURE

Semiconductor wafers are typically disposed on flat platens during ion implantation and certain other processes performed during semiconductor device fabrication. Commonly, a semiconductor wafer is secured to a platen via electrostatic clamping, wherein an electrical voltage is applied to an embedded electrode in a platen and a resulting electric field holds a semiconductor wafer to the platen. Electrostatic clamping is preferable to mechanical clamping since mechanical clamping can damage and/or contaminate a semiconductor wafer.

The ability of a platen to securely clamp a semiconductor wafer thereto via electrostatic clamping largely depends on the proximity of the bottom surface of the semiconductor wafer to the top surface of the platen. Ideally, these surfaces are planar and are disposed in flat, continuous contact with one another. In some cases, a semiconductor wafer may be warped (e.g., deflected on the order of 20 thousandths of an inch (thou)), resulting in a relatively large gap between a bottom surface of the semiconductor wafer and a top surface of a platen. This may result in weak or ineffective electrostatic clamping. This problem can be exacerbated if the semiconductor wafer and the platen are exposed to high temperature or cryogenic processes (e.g., during high temperature or cryogenic ion implantation), wherein incoherent deflection of the semiconductor wafer and the platen may cause the gap therebetween to increase in size.

Thus, minimizing surface-to-surface proximity between a semiconductor wafer and a platen is desirable for facilitating secure electrostatic clamping therebetween. With respect to these and other considerations the present improvements may be useful.

SUMMARY

This Summary is provided to introduce a selection of concepts in a simplified form. This Summary is not intended to identify key features or essential features of the claimed subject matter, nor is this Summary intended as an aid in determining the scope of the claimed subject matter.

An electrostatic clamping system in accordance with a non-limiting embodiment of the present disclosure may include a platen, an electrostatic electrode associated with the platen, and a sealing cover having a concave lower surface defining a cavity and having a sealing ring extending about a periphery of the lower surface, the sealing cover movable relative to the platen for being moved onto, and being moved off of, a wafer disposed on the platen, the sealing cover further having an inlet valve for introducing a gas into a space between a cover body of the sealing cover and the wafer.

An electrostatic clamping system in accordance with another non-limiting embodiment of the present disclosure may include a platen, an electrostatic electrode embedded within the platen, a sealing cover having a concave lower surface defining a cavity and having a sealing ring extending about a periphery of the lower surface, the sealing cover coupled to an articulating support arm adapted to selectively move the sealing cover onto, and remove the sealing cover from, a wafer disposed on the platen, the sealing cover further having an inlet valve for introducing a gas into a space between a cover body of the sealing cover and the wafer, and a temperature management system integral with the sealing cover and comprising a temperature control element operable to vary a temperature of the sealing cover.

A method of operating an electrostatic clamping system including a platen, an electrostatic electrode associated with the platen, and a sealing cover having a concave lower surface defining a cavity and having a sealing ring extending about a periphery of the lower surface in accordance with a non-limiting embodiment of the present disclosure may include placing a semiconductor wafer on the platen, wherein the semiconductor wafer is warped and presents a concave bottom surface to the platen, lowering the sealing cover onto the semiconductor wafer with the sealing ring engaging a top surface of the semiconductor wafer and forming a fluid-tight seal between a cover body of the sealing cover and the semiconductor wafer, and pumping a gas into a space between the cover body and the semiconductor wafer via an inlet valve in the cover body.

BRIEF DESCRIPTION OF THE DRAWINGS

By way of example, various embodiments of the disclosed apparatus will now be described, with reference to the accompanying drawings, wherein.

DETAILED DESCRIPTION

Figure 1:
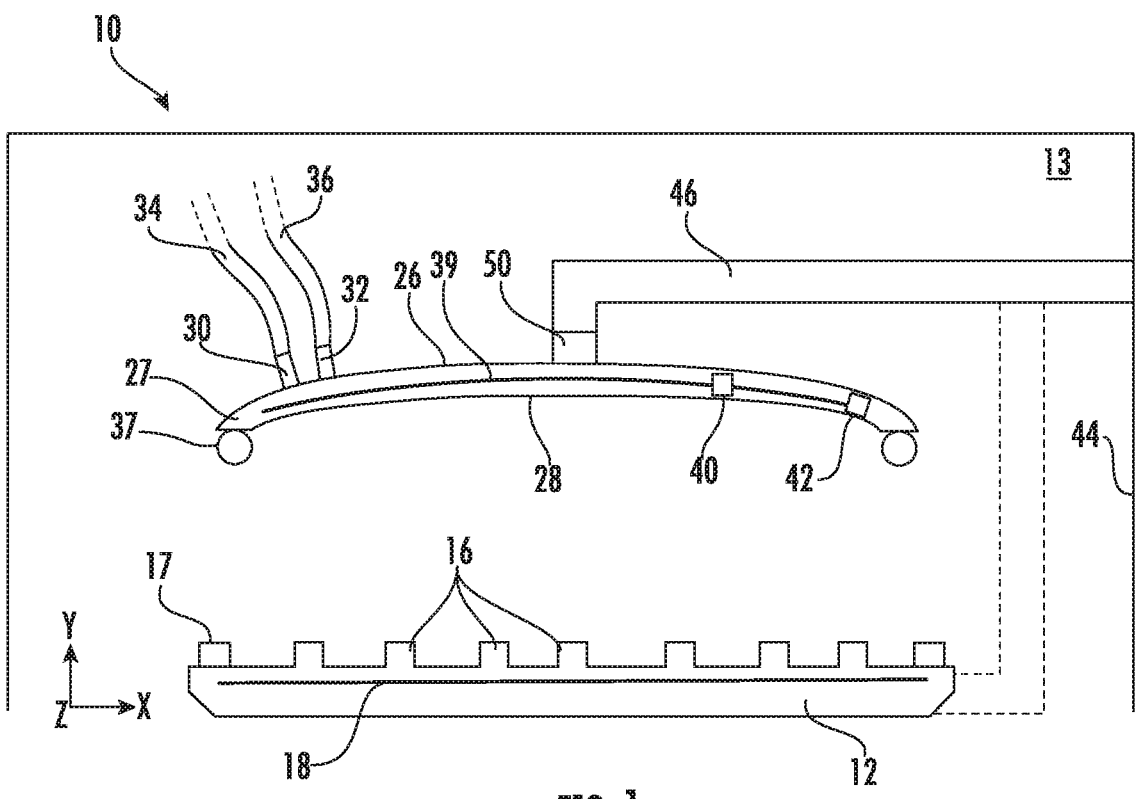
FIG. 1 is a cross-sectional side view illustrating an electrostatic clamping system in accordance with an exemplary embodiment of the present disclosure.

The present embodiments will now be described more fully hereinafter with reference to the accompanying drawings, wherein some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

Referring to FIG. 1, a cross-sectional side view illustrating an electrostatic clamping system 10 (hereinafter "the system 10") in accordance with an exemplary embodiment of the present disclosure is shown. The system 10 is provided for establishing a close clearance relationship between a supporting surface (or surfaces) of a platen 12 and a bottom surface of a warped or bowed semiconductor wafer disposed upon the platen 12 to facilitate effective electrostatic clamping therebetween as further described below.

The platen 12 of the system 10 may be similar to conventional platens commonly employed in ion processing systems (e.g., ion implantation systems, ion etching systems, etc.) for supporting and securely holding a semiconductor wafer to be processed. The platen 12 may be a generally planar, disc-shaped body and may be disposed within a process chamber 13. In various embodiments, the platen 12 may include a plurality of vertically extending mesas 16 for engaging a bottom surface of a semiconductor wafer disposed on the platen 12. The present disclosure is not limited in this regard. For example, alternative embodiments of the platen 12 are contemplated wherein the mesas 16 are omitted and the platen 12 is instead provided with a generally flat top surface.

Figure 3:
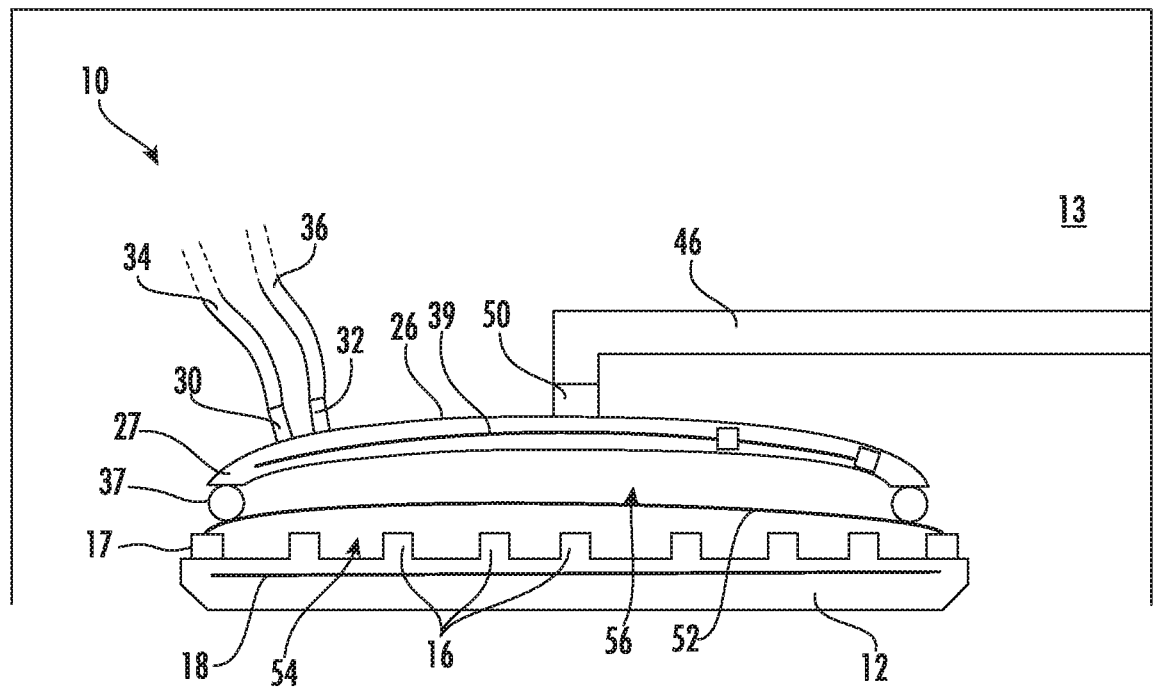
FIG. 3 is a cross-sectional side view illustrating the electrostatic clamping system of FIG. 1 with a sealing cover of the system lowered into engagement with a semiconductor wafer.
Figure 4:
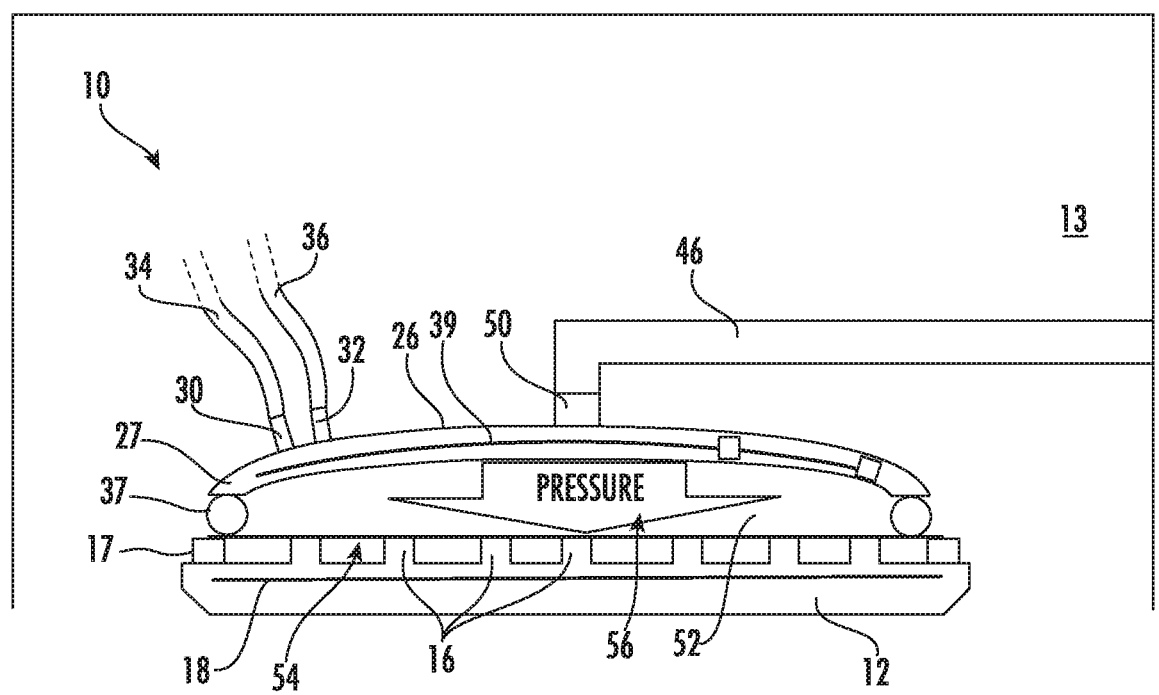
FIG. 4 is a cross-sectional side view illustrating the electrostatic clamping system of FIG. 1 being operated to flatten a semiconductor wafer.
Figure 5:
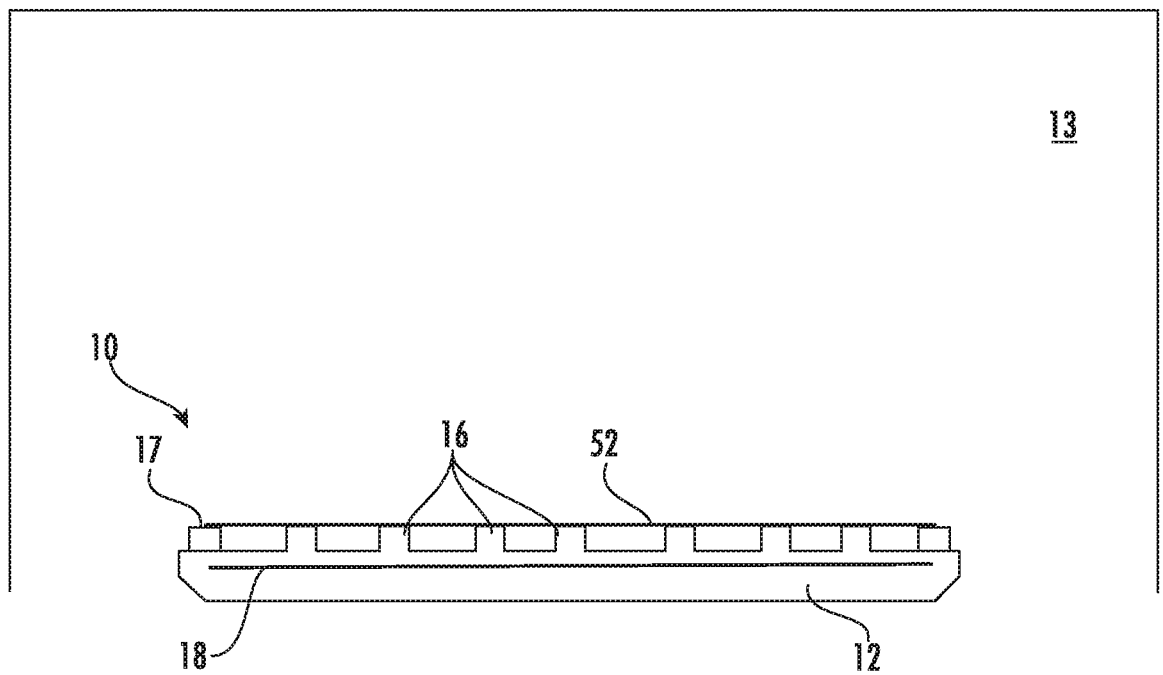
FIG. 5 is a cross-sectional side view illustrating the electrostatic clamping system of FIG. 1 with a sealing cover of the system removed to allow further processing of a flattened and electrostatically clamped semiconductor wafer disposed on the platen of the system.

In various embodiments, the platen 12 may include a backside gas seal 17 (hereinafter "BSG seal 17"). The BSG seal 17 may be an annular member (e.g., an O-ring or a gasket) disposed on a top surface of, and adjacent a periphery of, the platen 12. When a semiconductor wafer is disposed on the platen 12 (as shown in FIGS. 3-5), the BSG seal 17 may engage the bottom surface of the semiconductor wafer and may provide a fluid-tight seal between the semiconductor wafer and the platen 12. A backside gas (e.g., a cooling gas) may be supplied to the sealed space between the semiconductor wafer and the platen 12 to assist heat transfer either to or from the semiconductor wafer in a manner familiar to those of ordinary skill in the art. The present disclosure is not limited in this regard. In various embodiments of the present disclosure the BSG seal 17 may be omitted.

The platen 12 may further include one or more electrostatic electrodes associated therewith. For example, in the embodiment of the platen 12 shown in FIG. 1, the platen 12 may include an electrostatic electrode 18 embedded within the platen 12 a short distance below the mesas 16. The electrostatic electrode 18 may be connected to a source of electrical power (not shown) and may be arranged and configured to operate in the manner of an electrostatic clamp familiar to those of skill in the art. Particularly, by applying an electrical voltage to the electrostatic electrode 18, an electrical field can be generated and may hold a semiconductor wafer to the platen 12 via electrostatic force as further described below.

As will be appreciated by those of ordinary skill in the art, the platen 12 may further include any of a variety of heating elements (e.g., resistive or radiative heating elements) and/or any of a variety of cooling elements (e.g., channels, conduits, tubes, pipes, ducts, etc. embedded in, or extending through, the platen 12 for circulating a cooling fluid therethrough) for heating or cooling a semiconductor wafer disposed on the platen 12. The implementation of such heating and cooling elements in the platens of ion processing systems is well known in the art and will not be described in any further detail herein.

The system 10 may further include a movable sealing cover 26 located within the process chamber 13 adjacent the platen 12. The sealing cover 26 may include a domed or bowl-shaped cover body 27 having a concave lower surface 28 defining a cavity. In various embodiments, the cover body 27 may be formed of aluminum, stainless steel, or ceramic. The present disclosure is not limited in the is regard. The sealing cover 26 may further include an inlet valve 30 and an outlet valve 32 coupled to a gas supply line 34 and a vacuum line 36, respectively, for allowing a gas to be introduced into, and evacuated from, a space below the cover body 27 as described in greater detail below. The sealing cover 26 may further include a sealing ring 37 coupled to a lower peripheral edge of the cover body 27. The sealing ring 37 may be an annular member (e.g., an O-ring or a gasket) similar to the BSG seal 17. When the sealing cover 26 is lowered onto a semiconductor wafer the sealing ring 37 may engage the top surface of the semiconductor wafer and may provide a fluid-tight seal between the semiconductor wafer and the cover body 27. The sealing ring 37 may be formed of any material suitable for establishing a fluid-tight seal with a semiconductor wafer upon engagement therewith. Examples of such materials include, and are not limited to, nitrile rubber, fluoropolymer elastomers, thermoplastic polymers, polyimide-based plastics, silicone, ethylene propylene, propylene, and the like. For high temperature applications (e.g., wherein the sealing ring may be subjected to temperatures in excess of 700 degrees Celsius), the sealing ring 37 may be formed of materials including, and not limited to, ceramic, various metals, silicon, silicon carbide, glass and glass compounds, etc.

The sealing cover 26 may further include a temperature control system 38 having one or more temperature control elements 39 for heating and/or cooling the cover body 27 and the sealing ring 37. In various embodiments, the temperature control elements 39 may include resistive heating elements, such as wires, cables, plates, tapes, etc. embedded within the sealing cover 26 and connected to one or more sources of electrical power (now shown). Additionally or alternatively, the temperature control elements 39 may include one or more cooling elements, such as channels, conduits, tubes, pipes, ducts, etc. embedded in, or extending through, the sealing cover 26 for circulating a cooling fluid therethrough. The temperature control system 38 may further include a temperature sensor 40 (e.g., a thermocouple, a resistance temperature detector, etc.) for measuring a temperature of the sealing cover 26, as well as a controller 42 (e.g., a microcontroller, an application specific integrated circuit, etc.) connected to the temperature sensor 40 and to the temperature control elements 39. The controller 42 may be configured to operate the temperature control elements 39 to heat or cool the sealing cover 26 until a predetermined target temperature is measured via the temperature sensor 40. For example, the controller 42 may be configured to operate the temperature control elements 39 to heat or cool the sealing cover 26 until the temperature of the sealing cover 26 is equal to, or nearly equal to (e.g., within 15 degrees Celsius of), a temperature of the platen 12 and/or a temperature of a semiconductor wafer disposed on the platen 12. This may protect the platen 12 and/or the semiconductor wafer from thermal shock when the sealing cover 26 is moved into engagement with the semiconductor wafer as further described below.

The sealing cover 26 may be coupled to an interior wall 44 of the process chamber 13 by an articulating support arm 46 extending between the interior wall 44 and the cover body 27. In an exemplary alternative embodiment, the articulating support arm 46 may couple the cover body 27 to the platen 12 (as indicated by the segment of the support arm 46 drawn in dashed lines in FIG. 1). The present disclosure is not limited in this regard. In various embodiments, any type of mechanical arrangement or system capable of moving the sealing cover 26 onto and off of a semiconductor wafer disposed on the platen 12 as further described below may be substituted for the support arm 46.

The support arm 46 may be operable to move the cover body 27 in directions parallel to one or more of the X, Y, and Z axes of the Cartesian coordinate system shown in FIG. 1. In various embodiments, the support arm 46 may be thermally isolated from the sealing cover 26 to prevent heat from being transferred between the support arm 46 and the sealing cover 26. In various examples, this may be accomplished by implementing a thermal barrier 50 formed of a thermally insulating material (e.g., ceramic, glass, etc.) at or near the juncture of the support arm 46 and the cover body 27.

Figure 2:
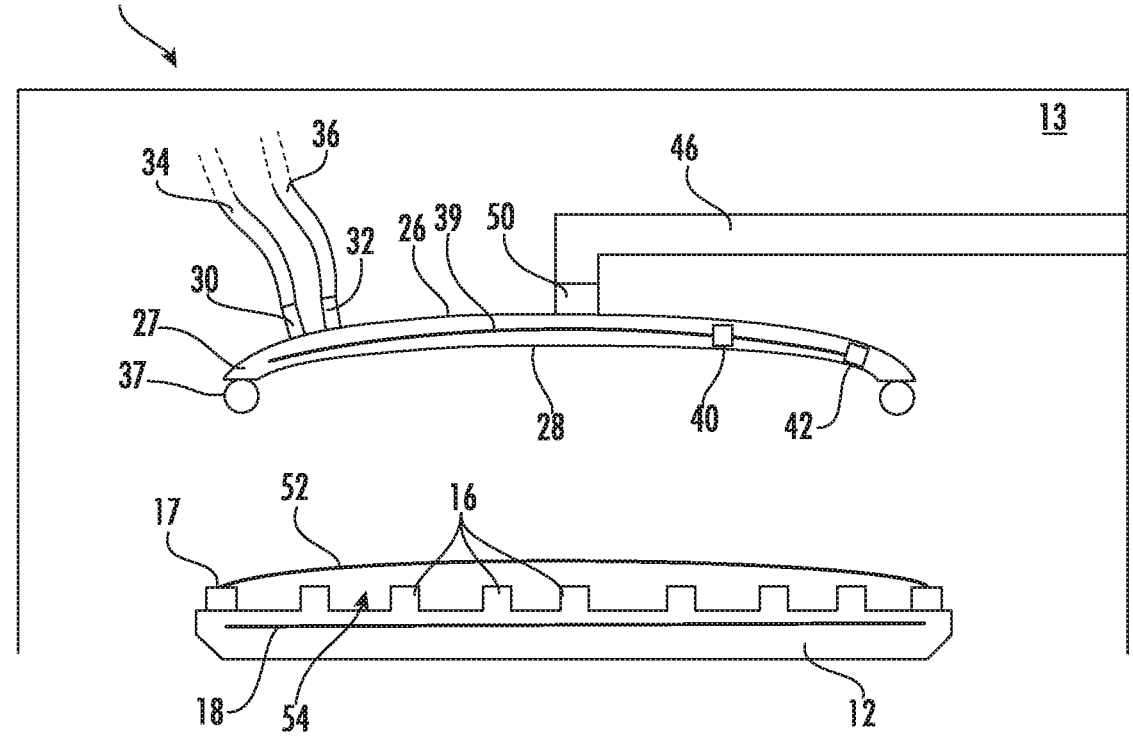
FIG. 2 is a cross-sectional side view illustrating the electrostatic clamping system of FIG. 1 with a semiconductor wafer disposed on a platen thereof.

During normal operation of the system 10, a semiconductor wafer is introduced into the process chamber 13 and is placed on the platen 12. Ideally, the semiconductor wafer will be planar or nearly planar and will rest flat across the mesas 16 of the platen 12, thus establishing a shortest possible distance between the electrostatic electrode 18 and the entirety of the semiconductor wafer to provide strong electrostatic coupling therebetween. In some cases, a semiconductor wafer, such as the semiconductor wafer 52 (hereinafter "the wafer 52") shown in FIG. 2, may be warped or bowed (e.g., deflected up to, and possibly greater than, 20 thou) and may present a concave bottom surface to the platen 12 (the deflection of the wafer 52 as shown in FIG. 2 is exaggerated for purposes of illustration). The resulting gap 54 between the wafer 52 and the platen 12 may attenuate the electrostatic force acting on the wafer 52, thus resulting in poor electrostatic coupling between the platen 12 and the wafer 52.

In order to improve the electrostatic coupling between the platen 12 and the wafer 52, the sealing cover 26 may be lowered onto the wafer 52 by the support arm 46 as shown in FIG. 3. The sealing ring 37 may engage the top surface of the wafer 52 and may establish a fluid-tight seal between the cover body 27 and the wafer 52. Once sealing cover 26 is in position and the seal is formed, a gas may be pumped into the space 56 between the cover body 27 and the wafer 52 via the gas supply line 34 and the inlet valve 30. In various embodiments, the gas may be an inert gas, such as nitrogen, argon, etc., or a non-inert gas, such has hydrogen. The present disclosure is not limited in this regard.

As the gas fills the space 56, the pressure within the space 56 increases and applies a downward force on the wafer 52. Eventually, the pressure flattens the wafer 52, forcing the wafer 52 to extend flatly across the mesas 16 as shown in FIG. 4. Thus, a shortest possible distance is established between the electrostatic electrode 18 and the entirety of the wafer 52, thus facilitating strong electrostatic coupling therebetween. At this point, the electrostatic coupling alone may hold the wafer 52 in flat engagement with the mesas 16. Thus, the gas may be vented from the space 56 via the outlet valve 32 and the vacuum line 36 to a port outside the process chamber 13. In various embodiments, the vacuum line 36 may be omitted, and the gas may be vented directly into the process chamber 13. The present disclosure is not limited in this regard. Finally, the sealing cover 26 may be moved off of and away from the wafer 52 by the support arm 46 as shown in FIG. 5, and the wafer 52 may be ready for subsequent ion processing (e.g., ion implantation, ion etching, etc.).

Figure 6:
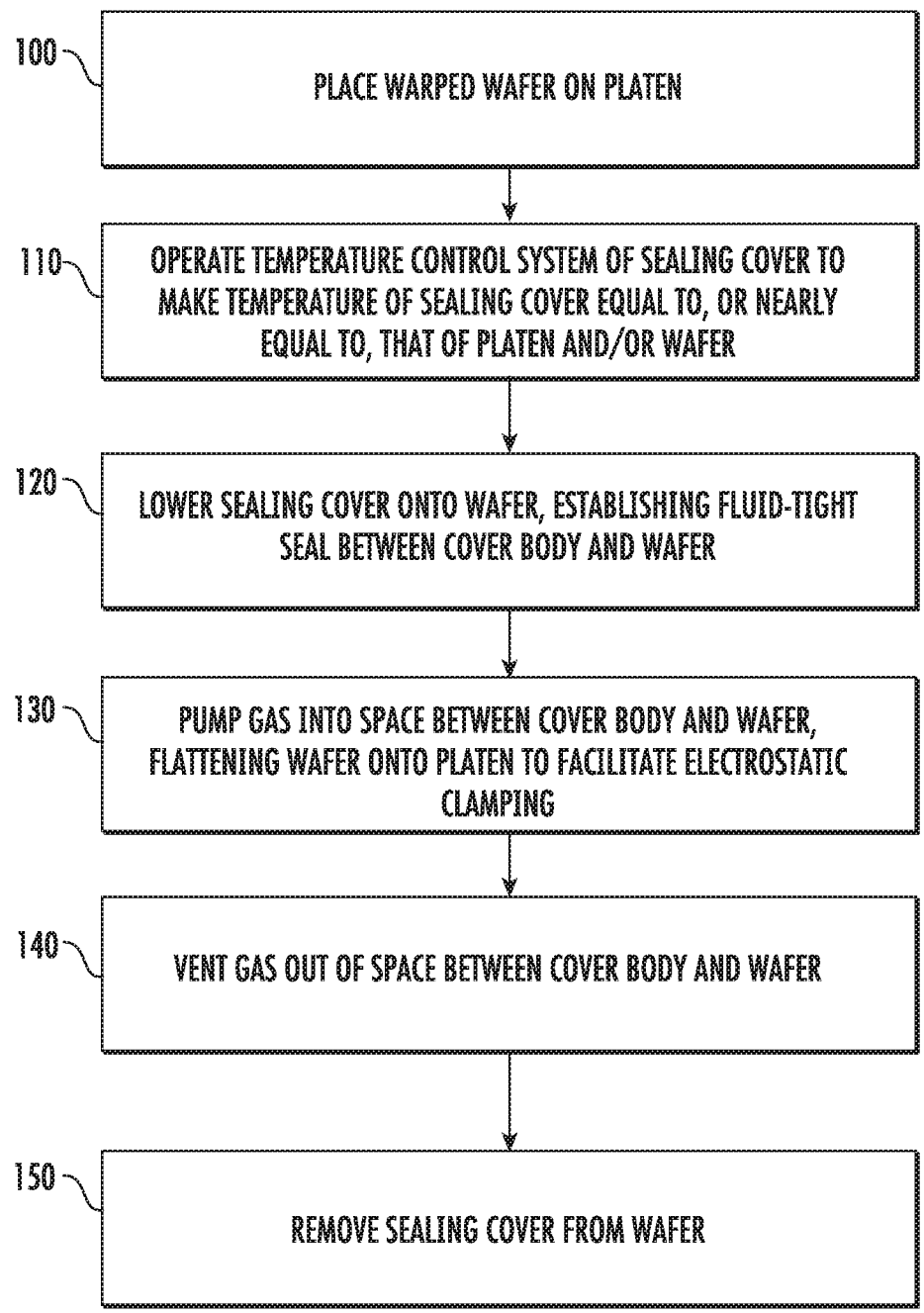
FIG. 6 is a flow diagram illustrating a method of operating an electrostatic clamping system in accordance with an exemplary embodiment of the present disclosure.

Referring to FIG. 6, a flow diagram illustrating an exemplary method for implementing the system 10 of the present disclosure to facilitate effective electrostatic clamping of a warped semiconductor wafer in accordance with the present disclosure is shown. The method will now be described in conjunction with the illustrations of the system 10 shown in FIGS. 1-5.

At block 100 of the exemplary method, the wafer 52 is introduced into the process chamber 13 of the system 10 and is placed on the platen 12 as shown in FIG. 2. The wafer may be warped or bowed (e.g., deflected up to, and possibly greater than, 20 thou) and may present a concave bottom surface to the platen 12 (the deflection of the wafer 52 as shown in FIG. 2 is exaggerated for purposes of illustration).

At block 110 of the exemplary method, the controller 42 may operate the temperature control elements 39 to heat or cool the sealing cover 26 the temperature of the sealing cover 26 is equal to, or nearly equal to (e.g., within 15 degrees Celsius of), a temperature of the platen 12 and/or a temperature of a semiconductor wafer disposed on the platen 12. This may protect the platen 12 and/or the wafer 52 from thermal shock when the sealing cover 26 is moved into engagement with the wafer as further described below.

At block 120 of the exemplary method, the sealing cover 26 may be lowered onto the wafer 52 by the support arm 46 as shown in FIG. 3. The sealing ring 37 may engage the top surface of the wafer 52 and may establish a fluid-tight seal between the cover body 27 and the wafer 52. At block 130 of the method, a gas may be pumped into the space 56 between the cover body 27 and the wafer 52 via the gas supply line 34 and the inlet valve 30. In various embodiments, the gas may be an inert gas, such as nitrogen, argon, etc., or a non-inert gas, such has hydrogen. The present disclosure is not limited in this regard. As the gas fills the space 56, the pressure within the space 56 increases and applies a downward force on the wafer 52. Eventually, the pressure flattens the wafer 52, forcing the wafer 52 to extend flatly across the mesas 16 as shown in FIG. 4. Thus, a shortest possible distance is established between the electrostatic electrode 18 and the entirety of the wafer 52, thus facilitating strong electrostatic coupling therebetween. At this point, the electrostatic coupling alone may hold the wafer 52 in flat engagement with the mesas 16.

At block 140 of the exemplary method, the gas may be vented from the space 56 via the outlet valve 32 and the vacuum line 36 to a port outside the process chamber 13. In various embodiments, the vacuum line 36 may be omitted, and the gas may be vented directly into the process chamber 13. The present disclosure is not limited in this regard. At block 150 of the method, the sealing cover 26 may be moved off of and away from the wafer 52 by the support arm 46 as shown in FIG. 5, and the wafer 52 may be ready for subsequent ion processing (e.g., ion implantation, ion etching, etc.).

As will be appreciated by those of ordinary skill in the art, the above-described system 10 and method provide distinct advantages relative to conventional clamping arrangements and methods for securing semiconductor wafers to platens. For example, the system 10 facilitates effective electrostatic clamping of bowed and warped semiconductor wafers. As a further advantage, such clamping is achieved with minimal mechanical contact with the semiconductor wafer, thus protecting the wafer from damage or contamination attendant with traditional clamping mechanisms and methods.

The present disclosure is, not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. An electrostatic clamping system comprising:
a platen;
an electrostatic electrode associated with the platen; and
a sealing cover having a concave lower surface defining a cavity and having a sealing ring extending about a periphery of the lower surface, the sealing cover movable relative to the platen for being moved onto, and being moved off of, a wafer disposed on the platen, the sealing cover further having an inlet valve for introducing a gas into a space between a cover body of the sealing cover and the wafer.

2. The electrostatic clamping system of claim 1, wherein the gas is selected from one of nitrogen, argon, and hydrogen.

3. The electrostatic clamping system of claim 1, wherein the sealing cover is coupled to an articulating support arm.

4. The electrostatic clamping system of claim 3, wherein the articulating support arm is mounted to an interior wall of a process chamber.

5. The electrostatic clamping system of claim 3, wherein the articulating support arm is mounted to the platen.

6. The electrostatic clamping system of claim 3, wherein the support arm is thermally insulated from the sealing cover by a thermally insulating material.

7. The electrostatic clamping system of claim 1, wherein the sealing cover incudes a temperature management system comprising a temperature control element operable to vary a temperature of the sealing cover.

8. The electrostatic clamping system of claim 7, temperature management system further comprising a controller connected to the temperature control element and configured to operate the temperature control element to vary the temperature of the sealing cover until a predetermined temperature is achieved, wherein the predetermined temperature is within 15 degrees Celsius of a temperature of the platen.

9. The electrostatic clamping system of claim 1, wherein the sealing cover incudes an outlet valve for venting the gas out of the space.

10. The electrostatic clamping system of claim 1, wherein the sealing ring is selected from one of an O-ring and a gasket.

11. An electrostatic clamping system comprising:
a platen;
an electrostatic electrode embedded within the platen;
a sealing cover having a concave lower surface defining a cavity and having a sealing ring extending about a periphery of the lower surface, the sealing cover coupled to an articulating support arm adapted to selectively move the sealing cover onto, and remove the sealing cover from, a wafer disposed on the platen, the sealing cover further having an inlet valve for introducing a gas into a space between a cover body of the sealing cover and the wafer; and a temperature management system integral with the sealing cover and comprising a temperature control element operable to vary a temperature of the sealing cover.

12. A method of operating an electrostatic clamping system including a platen, an electrostatic electrode associated with the platen, and a sealing cover having a concave lower surface defining a cavity and having a sealing ring extending about a periphery of the lower surface, the method comprising:
placing a semiconductor wafer on the platen, wherein the semiconductor wafer is warped and presents a concave bottom surface to the platen;
lowering the sealing cover onto the semiconductor wafer with the sealing ring engaging a top surface of the semiconductor wafer and forming a fluid-tight seal between a cover body of the sealing cover and the semiconductor wafer; and
pumping a gas into a space between the cover body and the semiconductor wafer via an inlet valve in the cover body.

13. The method of claim 12, wherein accumulated pressure in the space between the cover body and the semiconductor wafer forces the semiconductor wafer into flat engagement with the platen.

14. The method of claim 12, further comprising electrostatically clamping the semiconductor wafer to the platen.

15. The method of claim 12, further comprising heating the sealing cover.

16. The method of claim 15, wherein heating the sealing cover comprises heating the sealing cover to a temperature within 15 degrees Celsius of a temperature of at least one of the semiconductor wafer and the platen.

17. The method of claim 12, further comprising cooling the sealing cover.

18. The method of claim 17, wherein cooling the sealing cover comprises cooling the sealing cover to a temperature within 15 degrees Celsius of a temperature of at least one of the semiconductor wafer and the platen.

19. The method of claim 12, further comprising venting the gas from the space between the cover body and the semiconductor wafer via an outlet valve in the cover body.

20. The method of claim 12, wherein the gas is selected from one of nitrogen, argon, and hydrogen.

* * * * *